(12) United States Patent
Choi et al.

(10) Patent No.: US 11,916,512 B2
(45) Date of Patent: Feb. 27, 2024

(54) DC-DC CONVERTER FOR PHOTOVOLTAIC ENERGY STORAGE SYSTEM AND METHOD FOR CONTROLLING SAME

(71) Applicant: LG INNOTEK CO., LTD., Seoul (KR)

(72) Inventors: Sang Gyu Choi, Seoul (KR); Jae Geun Lee, Seoul (KR); Jeong Heum Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 352 days.

(21) Appl. No.: 17/271,672

(22) PCT Filed: Aug. 26, 2019

(86) PCT No.: PCT/KR2019/010841
§ 371 (c)(1),
(2) Date: Feb. 26, 2021

(87) PCT Pub. No.: WO2020/045918
PCT Pub. Date: Mar. 5, 2020

(65) Prior Publication Data
US 2021/0328547 A1   Oct. 21, 2021

(30) Foreign Application Priority Data

Aug. 28, 2018  (KR) .......................... 10-2018-0101209

(51) Int. Cl.
*H02M 1/32*       (2007.01)
*H02S 40/38*      (2014.01)
*H02S 50/10*      (2014.01)
*G01R 27/18*      (2006.01)
*H02M 3/158*      (2006.01)
*H02M 1/00*       (2006.01)

(52) U.S. Cl.
CPC ............... *H02S 50/10* (2014.12); *H02M 1/32* (2013.01); *H02M 3/158* (2013.01); *G01R 27/18* (2013.01); *H02M 1/0003* (2021.05); *H02S 40/38* (2014.12)

(58) Field of Classification Search
None
See application file for complete search history.

(56) References Cited

U.S. PATENT DOCUMENTS

| | | | |
|---|---|---|---|
| 7,042,161 B1 | 5/2006 | Konopka | |
| 2008/0084117 A1* | 4/2008 | Sander | ...................... H02J 7/35 307/46 |
| 2012/0120694 A1* | 5/2012 | Tsuchiya | ........... H01L 31/02021 363/131 |
| 2013/0113452 A1 | 5/2013 | Reichard et al. | |

(Continued)

FOREIGN PATENT DOCUMENTS

| | | |
|---|---|---|
| KR | 10-1202355 B1 | 11/2012 |
| KR | 10-2014-0085555 A | 7/2014 |

(Continued)

*Primary Examiner* — Jue Zhang
(74) *Attorney, Agent, or Firm* — Birch, Stewart, Kolasch & Birch, LLP

(57) ABSTRACT

An embodiment provides a DC-DC converter for sensing a grounded state and a method for controlling same in a photovoltaic energy storage system. Specifically, the converter can sense a grounded state on the basis of the magnitude of voltage applied to a resistor and provide a notification.

20 Claims, 7 Drawing Sheets

(56) References Cited

U.S. PATENT DOCUMENTS

2015/0192630 A1\* 7/2015 Tsukamoto ............ G01R 31/40
                                                    324/426
2017/0033679 A1    2/2017 Kaufman
2018/0011149 A1    1/2018 Tsai et al.
2018/0041164 A1\*  2/2018 Sano ...................... H02S 50/10

FOREIGN PATENT DOCUMENTS

WO   WO 2004/093284 A1   10/2004
WO   WO-2020040532 A1 \*  2/2020  ............. H02J 3/381

\* cited by examiner

DC-DC CONVERTER FOR PHOTOVOLTAIC ENERGY STORAGE SYSTEM AND METHOD FOR CONTROLLING SAME

CROSS REFERENCE TO RELATED APPLICATIONS

This application is the National Phase of PCT International Application No. PCT/KR2019/010841, filed on Aug. 26, 2019, which claims priority under 35 U.S.C. 119(a) to Patent Application No. 10-2018-0101209, filed in the Republic of Korea on Aug. 28, 2018, all of which are hereby expressly incorporated by reference into the present application.

TECHNICAL FIELD

In the present disclosure, a DC-DC converter and a method for controlling same for sensing a grounding state in a photovoltaic energy storage system are disclosed.

BACKGROUND ART

Recently, as awareness of environmental protection has been increased, interest in a method of generating electricity without discharging pollutants such as carbon dioxide has been emerged. In particular, in the case of a power generation system using solar light, the development and installation cost of the technology becomes cheaper powered by the technological advancement, and the supply is gradually expanding.

In such a solar power generation system, a plurality of solar cells is assembled to form a plurality of photovoltaic modules. The DC power generated from the plurality of photovoltaic modules is converted to AC power through an inverter, and thus, it can be immediately used in industrial facilities.

Meanwhile, in the case of solar power supply generation, a gap in power generation, during which sufficient power generation is not achieved due to night time when solar light is unavailable or changes in weather, occurs inevitably. Therefore, in order to compensate for such disadvantages, a solar power generation system is essentially equipped with a battery to enable stable power supply.

However, when an unexpected grounding occurs in the solar power generation system, problems such as damage to the system or excessive power consumption and the like may occur.

DETAILED DESCRIPTION OF THE INVENTION

Technical Subject

In the present disclosure, in a photovoltaic energy storage system, a DC-DC converter for sensing a battery state and a control method thereof may be disclosed. Specifically, a DC-DC converter in which the DC-DC converter includes a ground sensing circuit, and determines a ground state through information obtained from the ground sensing circuit, and a control method thereof are disclosed. Of course, the technical problem to be solved is not limited to the technical problems as described above, and various technical problems may be further included within a range that is obvious to a person skilled in the art.

Technical Solution

A DC-DC converter according to a first aspect comprises: a converting circuit that converts power received from a solar power source and is connected to a battery; a ground sensing circuit including a plurality of resistors and ground sensing switches and used for sensing a grounding state; and a processor configured to determine the grounding state based on voltages applied to the plurality of resistors, wherein the processor may determine the grounding state based on a section in which a value of a voltage applied to a measurement resistor, which is one of the plurality of resistors, belongs.

In addition, the plurality of resistors includes: a first resistor; a second resistor; and the measurement resistor, wherein the first resistor, the second resistor and the measuring resistor are connected in series, and wherein a node between the first resistor and the second resistor may be connected to ground.

In addition, the processor may periodically turn on or off the ground sensing switch by controlling the ground sensing switch.

In addition, the processor determines the grounding state as a normal state when the section in which the value of the voltage applied to the measurement resistor belongs is a first section, and determines the grounding state as an abnormal state when the section in which the voltage applied to the measurement resistor belongs is a second section or a third section.

In addition, the processor may output a notification indicating an error on the battery when the section in which the value of the voltage applied to the measuring resistor belongs is not any of the first section, the second section, and the third section.

In addition, the first resistor and the second resistor may be about 1.2 mΩ, and the measurement resistor may be about 62 kg.

Further, when the voltage specification of the battery is about 90V to about 126V, the first section may be a section of about 0.77V or more and about 1.08V or less.

In addition, when the voltage specification of the battery is about 126V to about 176V, the first section may be a section of about 1.08V or more and about 1.50V or less.

In addition, when the voltage specification of the battery is about 90V to about 126V, the second section may be about 1.52V or more and about 2.13V or less.

In addition, when the voltage specification of the battery is about 126V to about 176V, the second section may be about 2.13V or more and about 2.98V or less.

A DC-DC converter control method according to the second aspect comprises the steps of: turning on a ground sensing switch; determining the value of a voltage applied to the measurement resistor among a first resistor, a second resistor, and
    a measurement resistor connected in series with the ground sensing switch; and determining a grounding state based on a section in which the voltage applied to the measurement resistor belongs, wherein a node to which the first resistor and the second resistor are connected may be connected to ground.

The third aspect can provide a computer-readable recording medium in which a program for executing the method of the second aspect on a computer is recorded.

Advantageous Effects

The present disclosure may disclose a DC-DC converter and a method for controlling same for sensing a grounding state in a photovoltaic energy storage system

BEST MODE

Hereinafter, embodiments of the present invention will be described in detail with reference to the accompanying drawings. However, the technical idea of the present invention is not limited to some embodiments to be described, but may be implemented in various forms, and if it is within the scope of the technical idea of the present invention, one or more of the components may be selected, combined, and substituted between the embodiments for use. In addition, terms (including technical and scientific terms) used in the embodiments of the present invention are generally understood by those of ordinary skill in the technical field to which the present invention belongs unless explicitly defined and described, and it can be interpreted as a meaning, and terms generally used, such as terms defined in a dictionary, may be interpreted in consideration of the meaning in the context of the related technology. In addition, terms used in the embodiments of the present invention are for describing the embodiments and are not intended to limit the present invention. In the present specification, the singular form may include the plural form unless specifically stated in the phrase, and when described as "at least one (or more than one) of A and B and C", it may contain one or more of all combinations that can be combined with A, B, and C. In addition, terms such as first, second, A, B, (a), (b), and the like may be used in describing the components of the embodiment of the present invention. These terms are only for distinguishing the component from other components, and are not limited to the nature, order, or order of the component by the term. And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components. In addition, when it is described as being formed or disposed in the "top (upper side) or bottom (lower side)" of each component, the top (upper side) or bottom (lower side) not only includes a case when the two components are in direct contact with each other but also includes a case where one or more other components are formed or disposed between the two components. In addition, when expressed as "top (upper side) or bottom (lower side)", the meaning of not only an upward direction but also a downward direction based on one component may be included.

In addition, the numerical values described below may be expanded and interpreted as numerical values within a reasonable range due to errors or the like. For example, a number written as "1" can be interpreted as "1.01".

Hereinafter, embodiments of the present invention will be described in detail with reference to the drawings.

Figure 1:
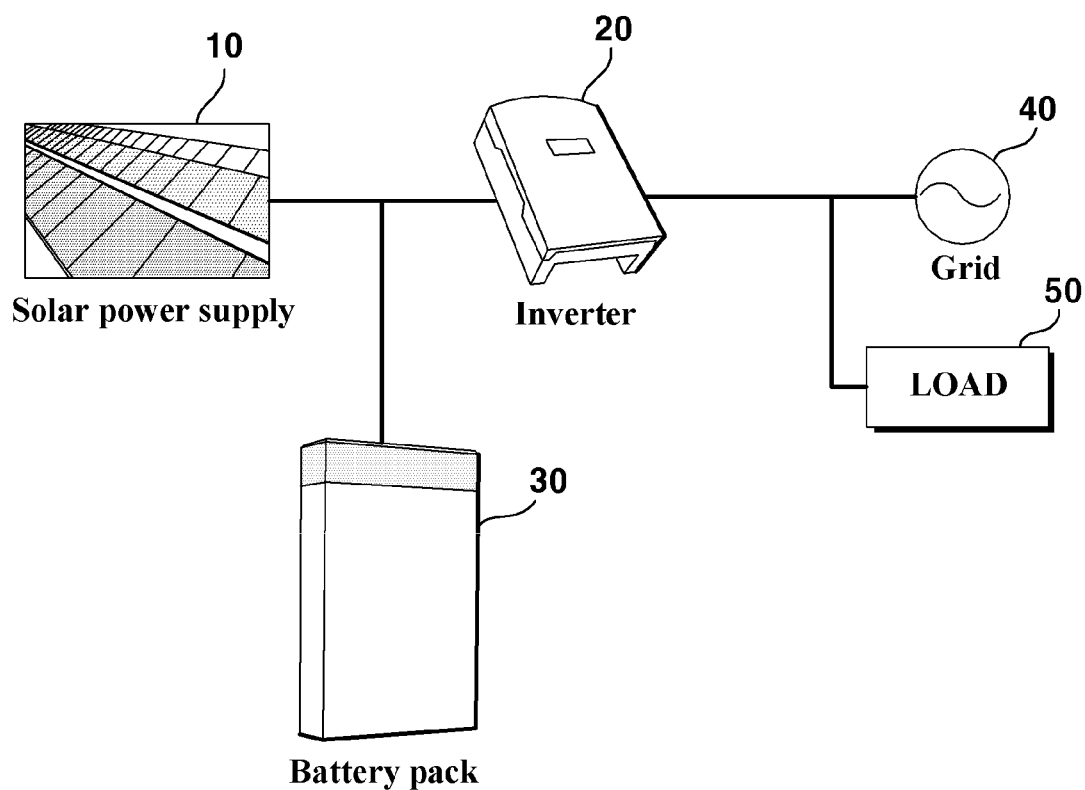
FIG. 1 is a diagram illustrating a solar power generation system according to an embodiment. A photovoltaic energy storage system may be an example of a solar power generation system.

FIG. 1 is a diagram illustrating a solar power generation system according to an embodiment. A photovoltaic energy storage system may be an example of the solar power generation system.

As illustrated in FIG. 1, a solar power generation system may comprise a solar power supply 10, a single-phase inverter 20, a battery pack 30, and a load 50.

However, it can be understood by a person skilled in the art that general-purpose components other than the components illustrated in FIG. 1 may be further included in the solar power generation system. For example, the solar power generation system may further include a single-phase grid 40. Or, according to another embodiment, it may be understood by a person skilled in the art that some of the components illustrated in FIG. 1 may be omitted.

The solar power supply 10 according to an embodiment may be composed of a plurality of photovoltaic modules in which photovoltaic cells are assembled, and a photovoltaic cell formed by bonding a p-type semiconductor and an n-type semiconductor generates electricity with light. Specifically, when a light is irradiated on a photovoltaic cell, electrons and holes are generated therein. The generated charges are moved to the P and N poles, respectively, and by this action, a potential difference occurs between the P and N poles, and at this time, when a load is connected to the photovoltaic cell a current flows. Here, the photovoltaic cell refers to the smallest unit that generates electricity, and the photovoltaic cells are gathered to form a photovoltaic module, and the photovoltaic module may form an array connected in series/parallel to form a solar power supply 10.

In order to supply a power to the power grid 40 or the load 50, the inverter 20 according to an embodiment may convert a direct current (DC) power generated by the solar power supply 10 by the photoelectric effect to an alternating current (AC) power. Here, the power grid 40 may refer to a grid for transmitting and distributing power produced by the solar power generation system. Meanwhile, the amount of power generated by the solar power supply 10 is continuously changed by temporal factors such as sunrise and sunset, or external factors such as weather and the like. Therefore, the inverter 20 controls the voltage generated from the solar power supply 10 to find the maximum power and supply it to the power grid 40. At this time, when a case occurs in that the power for operating the inverter is lower than the output power of the inverter, the inverter 20 may consume the power of the power grid 40 in reverse. Of course, in this case, the inverter may prevent power from being reversed by blocking the power flowing into the power grid 40. Accordingly, various optimal control methods for extracting maximum power from the solar power supply 10 are applied to the solar power generation system, so that the above-described operation of the inverter 20 can be performed more efficiently.

As a representative maximum power point (MPP) method of the solar power supply 10, there are a perturbation and observation (PO) method, an incremental conductance (IC) control method, a constant voltage (CV) control method, and the like. Here, the PO method is a method of periodically measuring the voltage and current of the solar power supply 10 to calculate power and then tracking the MPP using the power value. The IC control method is a method of measuring the voltage and current generated from the solar power supply 10, so that the rate of change of the power with respect to the change of the operating point of the terminal voltage of the array becomes '0'. The CV control method is a method of controlling the solar power supply 10 with a constant reference voltage (refV) regardless of the operating voltage or power of the array. According to each optimal control method, a power source input from the solar power supply 10 to the inverter may operate as a voltage source or a current source.

The load 50 according to an embodiment may refer to a product using an electricity type used in real life. For example, the inverter 20 may obtain AC power of a desired voltage and frequency through an appropriate conversion method, a switching element, or a control circuit, and supply electricity to home appliances in general homes or machinery products in industrial facilities.

In addition, in the case of solar power generation, a gap in power generation, during which sufficient power generation is not achieved due to night time when solar light is unavailable or changes in weather, occurs inevitably. Therefore, in order to compensate for such disadvantages, the solar power generation system is essentially equipped with a battery to enable stable power supply.

A battery pack 30 according to an embodiment may include at least one of a converter, a battery pack, a battery management system (BMS), and a battery control circuit.

The battery may be composed of a lithium ion battery or a nickel hydrogen battery, but is not necessarily limited to this configuration, and may refer to a battery that can be used semi-permanently through charging.

DC-DC converter is a device that can convert DC power produced through the solar power supply 10 into DC power suitable for a battery. In general, a power is converted in a way that a DC power is converted into an AC power and then the AC power is reverse converted to a DC power.

The battery management system (BMS) may provide a function of misuse protection of cells constituting the battery, balancing between unit cells, measuring the remaining amount of the charge (SOC), temperature maintenance management, or system monitoring function. Therefore, based on a sensor measuring the state of the cell and a function of receiving the measured value of the sensor and transmitting it to the control system of the applied product, it is possible to build and control circuits that generate an abnormal signal when the temperature and charging state and the like of the system exceed the set value and cut-off and open the power circuit between cells.

Meanwhile, the inverter 20 and the battery pack 30 may further include a display device (not shown). For example, the user can check the supply and demand status of the power of the solar panel, reverse wiring, sleep mode operation, or the state of charge of the battery through the display device. Meanwhile, the display device may be a liquid crystal display, a thin film transistor-liquid crystal display, an organic light-emitting diode, a flexible display, a three dimensional (3D) display, an electrophoretic display, or the like. In addition, the display device may include two or more displays depending on the implementation type. In addition, when the touch pad of the display has a layer structure and is configured as a touch screen, the display may also be used as an input device in addition to an output device.

In addition, the inverter 20 and the battery pack 30 may communicate with each other through wired communication or wireless communication. For example, the inverter 20 and the battery pack 30 may include a Wi-Fi chip, a Bluetooth chip, a wireless communication chip, an NFC chip, or the like. Of course, the inverter 20 and the battery pack 30 may communicate with each other using various external devices using a Wi-Fi chip, a Bluetooth chip, a wireless communication chip, an NFC chip, and the like. The Wi-Fi chip and the Bluetooth chip can perform communication using a Wi-Fi method and a Bluetooth method, respectively. In the case of using a Wi-Fi chip or a Bluetooth chip, various types of connection information such as SSID, session key, and the like are first transmitted and received, and by using this, communication is connected and then various types of information may be transmitted and received. The wireless communication chip may perform communication according to various communication standards such as IEEE, ZigBee, 3rd Generation (3G), 3rd Generation Partnership Project (3GPP), Long Term Evolution (LTE), and the like. The NFC chip can operate in a Near Field Communication (NFC) method using a 13.56 MHz band among various RF-ID frequency bands such as 135 kHz, 13.56 MHz, 433 MHz, 860 to 960 MHz, 2.45 GHz, and the like.

Figure 2:
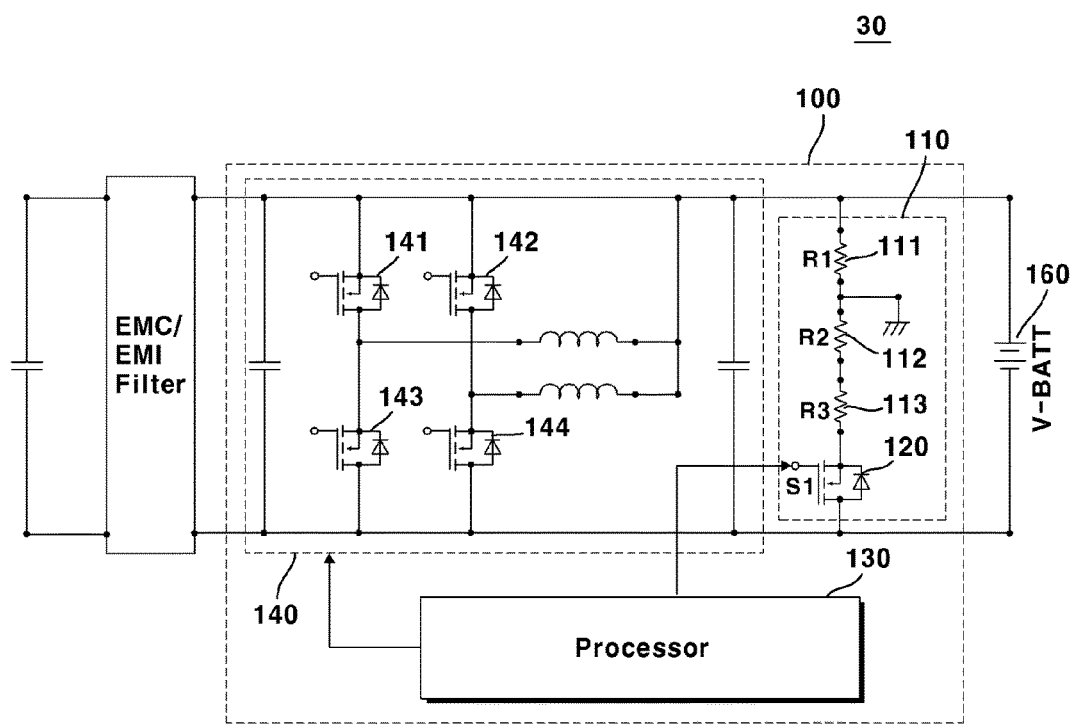
FIG. 2 is a block diagram illustrating an example in which the DC-DC converter 100 according to an embodiment is connected to the ground sensing circuit 110 and being operated.

FIG. 2 is a block diagram illustrating an example in which the DC-DC converter 100 according to an embodiment is connected to the ground sensing circuit 110 and being operated.

As illustrated in FIG. 2, the battery pack 30 may include a DC-DC converter 100 and a battery 160. In addition, referring to FIG. 2, the DC-DC converter 100 may include a ground sensing circuit 110, a converting circuit 140, and a processor 130. In addition, the ground sensing circuit 110 may include a plurality of resistors 111, 112, and 113, and a ground sensing switch 120.

However, it can be understood by a person skilled in the art that general-purpose components other than the components illustrated in FIG. 2 may be further included in the battery pack 30 or the DC-DC converter 100. For example, the battery pack 30 or the DC-DC converter 100 may further include a memory (not shown). Or, according to another embodiment, it may be understood by a person skilled in the art that some of the components illustrated in FIG. 2 may be omitted.

Referring to FIG. 2, the converting circuit 140 may convert power received from the solar power source 10 and is connected to the battery 160. The converting circuit 140 according to an embodiment may convert power received from the solar power source 10. For example, the converting circuit 140 may convert a voltage of power applied from the solar power source 10. Specifically, the converting circuit 140 may convert a voltage using a plurality of switches 141, 142, 143, and 144 included in the converting circuit 140. The plurality of switches 141, 142, 143, and 144 may operate according to a control signal received from the processor 130.

The converting circuit 140 may include a capacitor, an inductor, a resistor, a switch, and the like, and may be configured as a half bridge or a full bridge.

The ground sensing circuit 110 according to an embodiment may include a plurality of resistors 111, 112, and 113 and a ground sensing switch 120, and may sense a grounding state of the DC-DC converter 100. The plurality of resistors 111, 112, and 113 may include a first resistor 111, a second resistor 112, and a measurement resistor 113.

The processor 130 according to an embodiment may determine a grounding state based on information received from the ground sensing circuit 110. The processor 130 may determine a grounding state based on voltages applied to a plurality of resistors. For example, the processor 130 may determine the grounding state based on a section in which the value of the voltage applied to the measurement resistor 113, which is one of the plurality of resistors 111, 112, and 113, belongs.

For example, the processor 130 determines the grounding state as a normal state if the section in which the value of the voltage applied to the measurement resistor 113 belongs is the first section, and if the section in which the voltage applied to the measurement resistor 113 belongs is the second section or the third section, the grounding state may be determined as an abnormal state. Specific embodiments of the first section, the second section, and the third section will be described later in FIG. 6.

In addition, the processor 130 may control the battery sensing switch 120 to turn on or off the ground sensing circuit 110. For example, the processor 130 may periodically turn on or off the ground sensing switch 120 by controlling the ground sensing switch 120.

The processor 130 may control not only the ground sensing circuit 110 but also the converting circuit 140. For example, the processor 130 may convert a voltage of the power received from the solar power source 10 by controlling a plurality of switches 141, 142, 143, and 144 included in the converting circuit 140.

The plurality of resistors 111, 112, and 113 may include a first resistor 111, a second resistor 112, and a measurement resistor 113. The first resistor 111, the second resistor 112, and the measurement resistor 113 may be connected in series, and a node between the first resistor 111 and the second resistor 112 may be connected to the ground.

The resistance values of the first resistor 111, the second resistor 112, and the measurement resistor 113 may be predetermined values. For example, the first resistor and the second resistor may be about 1.2 mΩ, and the measurement resistor may be about 62 kΩ.

Figure 3:
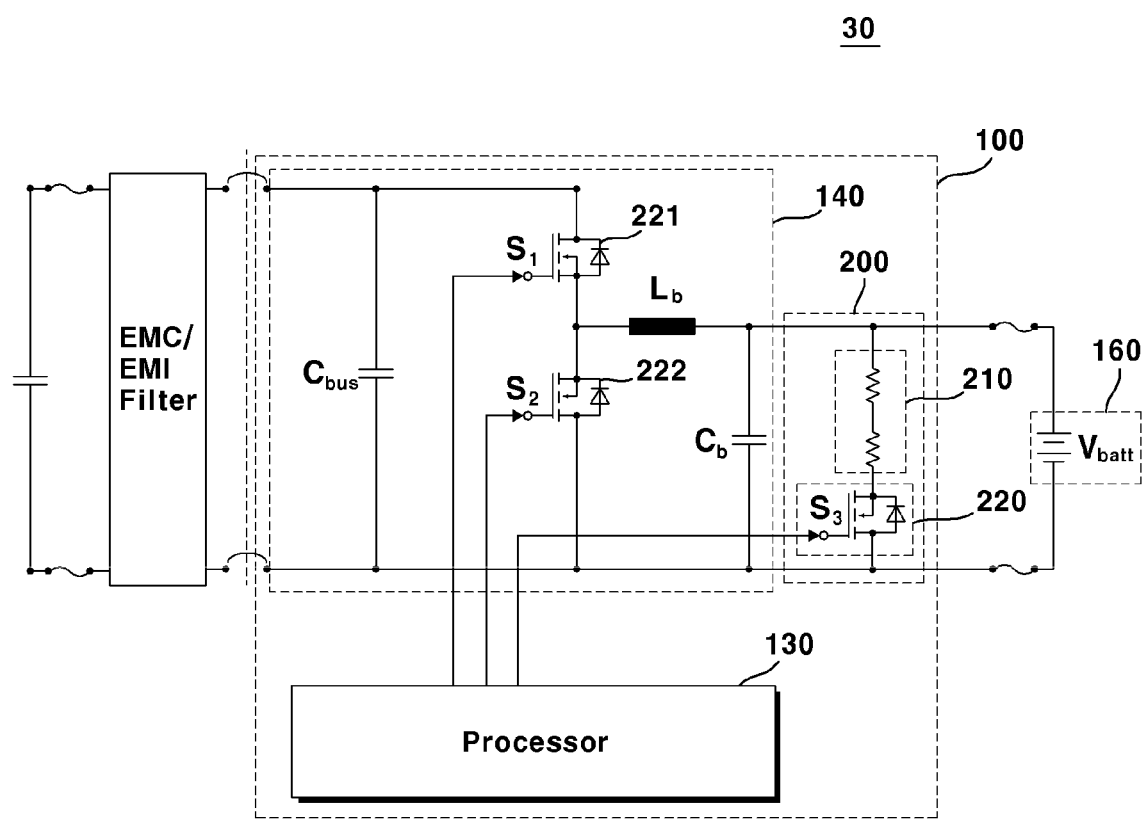
FIG. 3 is a block diagram illustrating an example in which the DC-DC converter 100 according to an embodiment is connected to the battery 160 and being operated.

FIG. 3 is a block diagram illustrating an example in which the DC-DC converter 100 according to an embodiment is connected to the battery 160 and being operated.

As illustrated in FIG. 3, the battery pack 30 may include a DC-DC converter 100 and a battery 160. In addition, referring to FIG. 3, the DC-DC converter 100 may include a battery sensing circuit 200, a converting circuit 140, and a processor 130. In addition, the battery sensing circuit 200 may include one or more resistors 210 and a battery sensing switch 220.

However, it can be understood by a person skilled in the art that general-purpose components other than the components illustrated in FIG. 3 may be further included in the battery pack 30 or the DC-DC converter 100. For example, the battery pack 30 or the DC-DC converter 100 may further include a memory (not shown). Or, according to another embodiment, it may be understood by a person skilled in the art that some of the components illustrated in FIG. 3 may be omitted.

The converting circuit 140 according to an embodiment may convert power received from the solar power source 10. For example, the converting circuit 140 may convert a voltage of power applied from the solar power source 10. Specifically, the converting circuit 140 may convert a voltage using a plurality of switches 221 and 222 included in the converting circuit 140. The plurality of switches 221 and 222 may operate according to a control signal received from the processor 130.

The converting circuit 140 may include a capacitor, an inductor, a resistor, a switch, and the like, and may be configured as a half bridge or a full bridge.

The battery sensing circuit 200 according to an embodiment may include one or more resistors 210 and a battery sensing switch 220, and may sense a state of the battery 160. Specifically, the battery sensing circuit 200 may sense the remaining amount of the battery 160 connected in parallel to the battery sensing circuit 200. Since the battery 160 is connected in parallel with the battery sensing circuit 200, the remaining amount of the battery 160 may be determined based on a current flowing through one or more resistors 210 or a voltage applied to one or more resistors 210. In addition, in the process of determining the remaining amount of the battery 160, the battery sensing circuit 200 may consume power of the battery 160.

The battery sensing circuit 200 may include a battery sensing switch 220. The battery sensing switch 220 may be turned on or off according to a situation so that the battery sensing circuit 200 is turned on or off. Specifically, the battery sensing switch 220 may be turned on or off depending on the current mode in which the DC-DC converter 100 is currently operating. For example, when the current mode is a sleep mode, the battery sensing switch 220 may be turned off to prevent the battery sensing circuit 200 from consuming power. As another example, when the current mode is an operation mode, the battery sensing switch 220 is turned on so that the battery sensing circuit 200 may sense the remaining amount of the battery 160. The sleep mode according to an embodiment may be a mode for reducing power consumption of the DC-DC converter 100 by deactivating functions other than a function required for communication with the inverter 20 among a plurality of functions.

The processor 130 according to an embodiment may control the battery sensing switch 220 based on the state of the battery 160.

The processor 130 may determine one of the plurality of modes as the current mode based on the state of the battery 160 and may turn off the battery sensing switch 220 when the current mode is a sleep mode.

When the remaining amount of the battery 160 is less than or equal to a first value, the processor 130 may determine the current mode as the sleep mode. The sleep mode according to an embodiment may be a mode for reducing power consumption of the DC-DC converter 100 by deactivating functions other than a function required for communication with the inverter 20 among a plurality of functions. Therefore, when the remaining amount of the battery 160 is less than or equal to the first value, the functions other than the functions required for communication with the inverter 20 among a plurality of functions are deactivated according to the control of the processor 130, and the power consumption of the DC-DC converter 100 can be reduced.

The processor 130 may control not only the battery sensing circuit 200 but also the converting circuit 140. For example, the processor 130 may convert a voltage of power received from the solar power source 10 by controlling a plurality of switches 221 and 222 included in the converting circuit 140.

Figure 4:
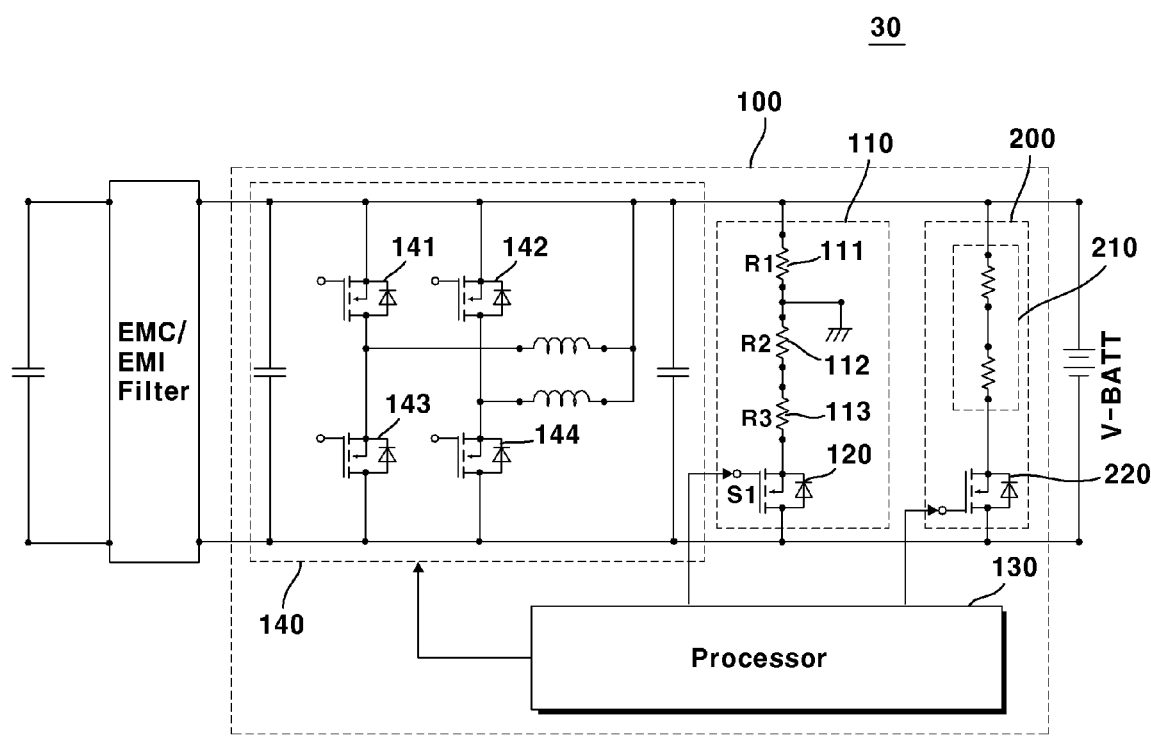
FIG. 4 is a block diagram illustrating an embodiment in which the DC-DC converter 100 according to an embodiment includes both a battery sensing circuit 200 and a ground sensing circuit 110.

FIG. 4 is a block diagram illustrating an embodiment in which the DC-DC converter 100 according to an embodiment includes both a battery sensing circuit 200 and a ground sensing circuit 110.

In this case, the DC-DC converter 100 may include a converting circuit 140, a battery sensing circuit 200, and a ground sensing circuit 110. The processor 130 may control all of the converting circuit 140, the battery sensing circuit 200, and the ground sensing circuit 110. For example, the processor 130 may turn on or off the battery sensing circuit 200 or the ground sensing circuit 110 by controlling the battery sensing switch 220 or the ground sensing switch 120.

Figure 5:
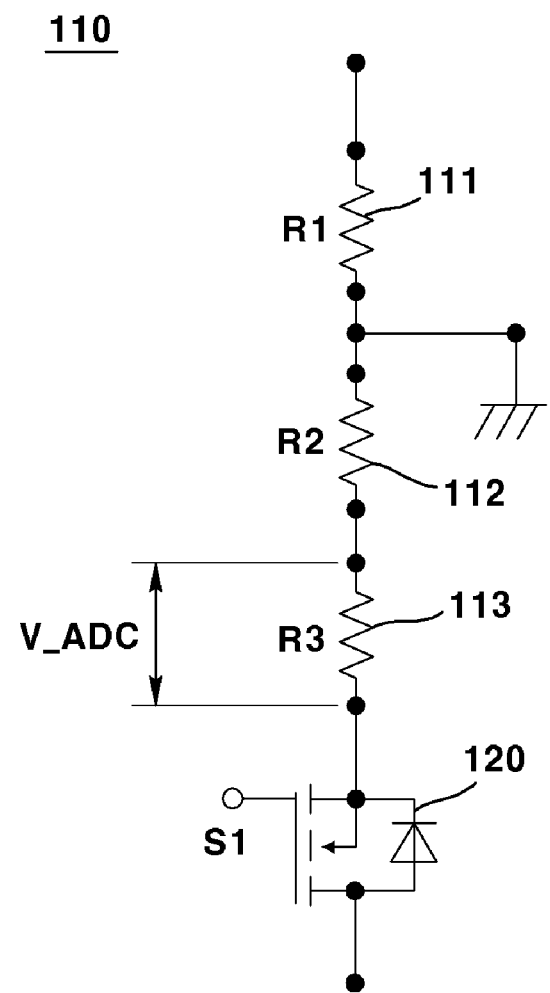
FIG. 5 is a diagram for explaining an embodiment in which the ground sensing circuit 110 according to an embodiment senses grounding.

FIG. 5 is a diagram for explaining an embodiment in which the ground sensing circuit 110 according to an embodiment senses grounding.

The ground sensing circuit 110 may include one or more resistors 111, 112, and 113, and a ground sensing switch 120. One or more resistors may include a first resistor 111, a second resistor 112, and a measurement resistor 113.

The processor 130 may determine a grounding state according to a section to which the voltage V_ADC applied to the measurement resistor 113 belongs. For example, if the section to which V_ADC belongs is a first section, the processor 130 may determine the grounding state as a normal state, and if the section to which the V_ADC belongs is a second section or a third section, determine the ground state as an abnormal state. A specific embodiment of the first to third sections may be referred to FIG. 6.

In addition, the processor 130 may output a notification indicating the determined ground state. In this case, the DC-DC converter 100 may output an audible notification through sound or a visual notification through a display.

When the section to which V_ADC belongs is not any of a first section, a second section, and a third section, the processor 130 may output a notification indicating an error on the battery 160.

Figure 6:
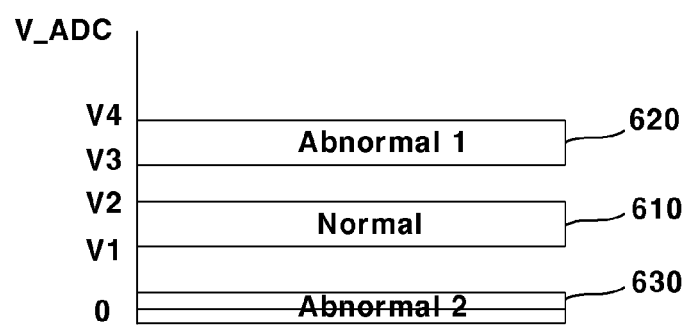
FIG. 6 is a diagram for describing an example in which the DC-DC converter 100 according to an embodiment determines a grounding state by using a voltage applied to a resistor.

FIG. 6 is a diagram for describing an example in which the DC-DC converter 100 according to an embodiment determines a grounding state by using a voltage applied to a resistor. Specifically, an example of determining the grounding state according to the voltage applied to the measurement resistor 113 is illustrated.

The values of the first resistor 111, the second resistor 112 and the measuring resistor 113, the values representing the first section, the second section, and the third section, and the like may be determined according to various preset conditions.

For example, when the voltage specification of the battery 160 is about 90V to about 126V, the first resistor and the second resistor are about 1.2 mg, and the measurement resistor may be about 62 kg. In this case, the first section 610 is a section of about 0.77V or more and about 1.08V or less, and the second section 620 may be a section of about 1.52V or more and about 2.13V or less.

As another example, when the voltage specification of the battery 160 is about 126V to about 176V, the first resistor and the second resistor are about 1.2 mg, and the measurement resistor may be about 62 kg. In this case, the first section 610 is a section of about 1.08V or more and about 1.50V or less, and the second section 620 may be a section of about 2.13V or more and about 2.98V or less.

Also, the third section 630 may represent a peripheral value of zero. For example, the third section 630 may be a section of about −0.5V or more and about 0.5V or less.

When the section in which the value of the voltage applied to the measurement resistor 113 belongs is not any of the first section 610, the second section 620, and the third section 630, a notification indicating an error on the battery 160 may be outputted. For example, when the value of the voltage applied to the measuring resistor 113 is about 3V, a notification indicating an error may be outputted.

Since the voltage specification of the commonly used battery 160 is about 90V to about 126V or about 126V to about 176V, when the first resistor 111 and the second resistor 112 are about 1.2 mg, and the measurement resistor 113 is set to about 62 kg, grounding can be easily determined using the voltage value applied to the measuring resistor 113. In general, in performing voltage sensing, it is easy to sense a voltage within 3V. Therefore, when the voltage specification of the battery 160 is followed, by not allowing the voltage applied to the measuring resistor 113 to exceed 3V at maximum, it is practically possible to easily and accurately determine whether it is grounded or not.

In addition, by determining the size of the first resistor 111 and the second resistor 112 having a relatively large size to have a larger value compared to the measurement resistor 113, when grounding occurs practically, damage can be minimized by reducing the amount of current flowing.

The above-described numerical values are for one embodiment only, and other numerical values to the effect as described above may be used.

In addition, the values representing the first section 610, the second section 620, and the third section 630 may be determined according to the voltage distribution principle, and it may be determined according to a voltage applied to the ground sensing switch 120 or other actual circuit state (e.g., the length of a line and the like).

Figure 7:
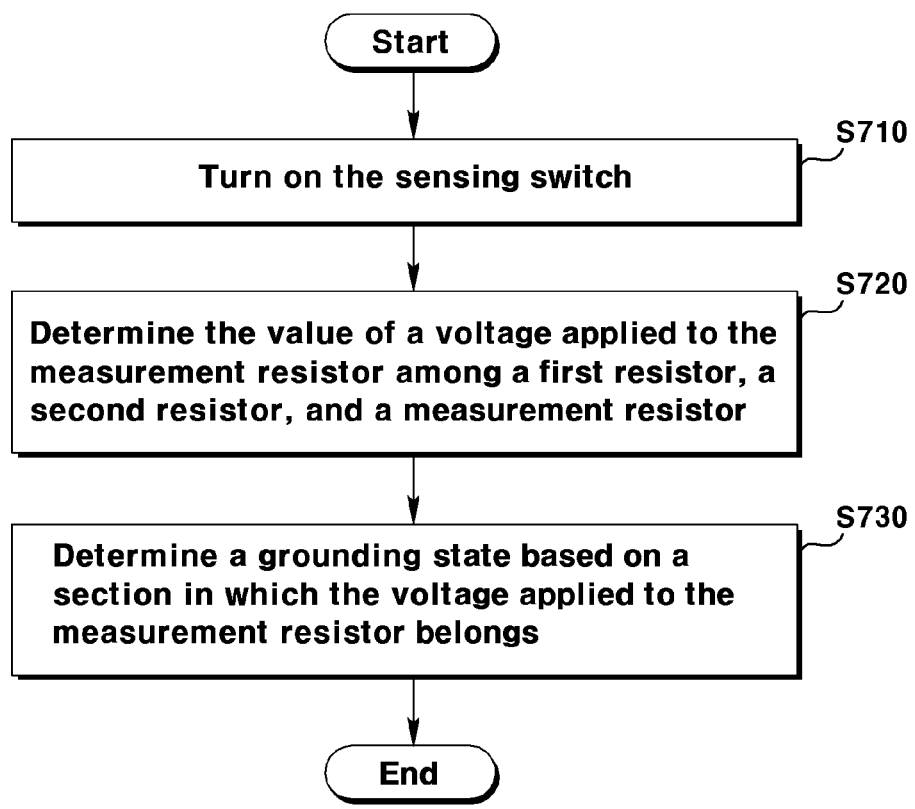
FIG. 7 is a flowchart illustrating an embodiment of a method in which the DC-DC converter 100 according to an embodiment senses a grounding state.

FIG. 7 is a flowchart illustrating an embodiment of a method in which the DC-DC converter 100 according to an embodiment senses a grounding state.

In step S710, the DC-DC converter 100 according to an embodiment may turn on the ground sensing switch 120. When the ground sensing switch 120 is turned on, the ground sensing circuit 110 may operate while consuming some power.

In step S720, the DC-DC converter 100 according to an embodiment can determine the value of the voltage applied to the measurement resistor 113 among the first resistor 111, the second resistor 112, and the measurement resistor 113 connected in series with the ground sensing switch 120. Specifically, the value of the voltage applied to the measurement resistor 113 among the first resistor 111, the second resistor 112, and the measurement resistor 113 can be determined according to the principle of voltage distribution, and can be determined according to voltage applied to the ground sensing switch 120 or other actual circuit state (e.g., length of a line and the like).

In step S730, the DC-DC converter 100 according to an embodiment may determine a grounding state based on a section in which the voltage value V_ADC applied to the measurement resistor 113 belongs.

For example, if the section to which V_ADC belongs is the first section, the processor 130 may determine the ground state as a normal state, and if the section to which the V_ADC belongs is the second section or the third section, determine the ground state as an abnormal state. A specific embodiment of the first to third sections may be referred to FIG. 6.

In addition, the processor 130 may output a notification indicating the determined grounding state. In this case, the DC-DC converter 100 may output an audible notification through sound or a visual notification through a display.

When the section to which V_ADC belongs is not any of the first section, the second section, and the third section, the processor 130 may output a notification indicating an error on the battery 160.

Meanwhile, the above-described method can be written as a program that can be executed on a computer, and can be implemented in a general-purpose digital computer that operates the program using a computer-readable recording medium. In addition, the structure of the data used in the above-described method can be recorded on a computer-readable recording medium through various means. The computer-readable recording medium includes storage media such as magnetic storage media (for example, ROM, RAM, USB, floppy disk, hard disk, and the like), optical reading media (for example, CD-ROM, DVD, and the like).

It will be understood by a person of ordinary skill in the art related to the present embodiment that it may be implemented in a modified form within a scope not departing from the essential characteristics of the above description. Therefore, the disclosed methods should be considered from an explanatory point of view rather than a limiting point of view. The scope of the present invention is illustrated in the claims rather than the foregoing description, and all differences within the scope equivalent thereto should be construed as being included in the present invention.

The invention claimed is:

1. A DC-DC converter comprising:
   a converting circuit for converting a power received from a solar power supply and being connected to a battery;
   a ground sensing circuit including a plurality of resistors including a measurement resistor and a ground sensing switch and used for sensing a grounding state; and
   a processor for determining the grounding state based on a voltage applied to the measurement resistor,
   wherein the processor determines the grounding state based on the voltage across the measurement resistor being within a first predetermined range.

2. The DC-DC converter according to claim 1, wherein the plurality of resistors includes a first resistor, a second resistor, and the measurement resistor,
   wherein the first resistor, the second resistor, and the measuring resistor are connected in series, and
   wherein a node between the first resistor and the second resistor is connected to ground.

3. The DC-DC converter according to claim 1, wherein the processor periodically turns on or off the ground sensing switch by controlling the ground sensing switch.

4. The DC-DC converter according to claim 1, wherein the processor determines the grounding state as a normal state when the voltage across the measurement resistor is within the first predetermined range, and determines the grounding state as an abnormal state when the voltage across the measurement resistor is within a second predetermined range which is greater than the first predetermined range or within a third predetermined range which is less than the first predetermined range.

5. The DC-DC converter according to claim 4, wherein the processor outputs a notification indicating an error on the battery when the voltage across the measuring resistor is not any of the first predetermined range, the second predetermined range, and the third predetermined range.

6. The DC-DC converter according to claim 4, wherein the first resistor and the second resistor are 1.2 mΩ, and the measurement resistor is 62 kΩ.

7. The DC-DC converter according to claim 6, wherein when the voltage specification of the battery is 90V to 126V, the first predetermined range is 0.77V or more and 1.08V or less.

8. The DC-DC converter according to claim 6, wherein when the voltage specification of the battery is 126V to 176V, the first predetermined range is 1.08V or more and 1.50V or less.

9. The DC-DC converter according to claim 6, wherein when the voltage specification of the battery is 90V to 126V, the second predetermined range is 1.52V or more and 2.13V or less.

10. The DC-DC converter according to claim 6, wherein when the voltage specification of the battery is 126V to 176V, the second predetermined range is 2.13V or more and 2.98V or less.

11. A DC-DC converter control method comprising:
    turning on a ground sensing switch;
    determining a value of a voltage applied to a measurement resistor among a first resistor, a second resistor, and the measurement resistor connected in series with the ground sensing switch; and
    determining a grounding state based on a voltage across the measurement resistor being with a predetermined range,
    wherein a node to which the first resistor and the second resistor are connected is connected to ground.

12. The DC-DC converter control method according to claim 11, wherein the ground sensing switch is turned on or off periodically.

13. The DC-DC converter control method according to claim 11, wherein the grounding state is determined as a normal state when the voltage across the measurement resistor is within the first predetermined range, and the grounding state is determined as an abnormal state when the voltage across the measurement resistor is within a second predetermined range which is greater than the first predetermined range or within a third predetermined range which is less than the first predetermined range.

14. The DC-DC converter control method according to claim 13, wherein a notification indicating an error on the battery is output when the voltage across the measuring resistor belongs is not within any of the first predetermined range, the second predetermined range, and the third predetermined range.

15. The DC-DC converter control method according to claim 13, wherein the first resistor and the second resistor are 1.2 mΩ, and the measurement resistor is 62 kΩ.

16. The DC-DC converter control method according to claim 15, wherein when the voltage specification of the battery is 90V to 126V, the first predetermined range is 0.77V or more and 1.08V or less.

17. The DC-DC converter control method according to claim 15, wherein when the voltage specification of the battery is 126V to 176V, the first predetermined range is 1.08V or more and 1.50V or less.

18. The DC-DC converter control method according to claim 15, wherein when the voltage specification of the battery is 90V to 126V, the second predetermined range is 1.52V or more and 2.13V or less.

19. The DC-DC converter control method according to claim 15, wherein when the voltage specification of the battery is 126V to 176V, the second predetermined range is 2.13V or more and 2.98V or less.

20. A solar power generation system comprising:
    a solar power supply;
    a DC-DC converter for converting a power received from the solar power supply; and
    a battery for receiving the converted power form the DC-DC converter,
    wherein the DC-DC converter comprises:
    a converting circuit for converting a power received from the solar power supply and being connected to a battery;

a ground sensing circuit including a plurality of resistors including a measurement resistor and a ground sensing switch and used for sensing a grounding state; and
a processor for determining the grounding state based on a voltage applied to the measurement resistor, and
wherein the processor determines the grounding state based on the voltage across the measurement resistor being within a predetermined range.

\* \* \* \* \*